United States Patent
Zjajo et al.

(10) Patent No.: US 8,122,423 B2
(45) Date of Patent: Feb. 21, 2012

(54) ANALOG CIRCUIT TESTING AND TEST PATTERN GENERATION

(75) Inventors: Amir Zjajo, Eindhoven (NL); Jose De Jesus Pineda de Gyvez, Eindhoven (NL); Alexander G. Gronthoud, Eindhoven (NL)

(73) Assignee: NXP B.V., Eindhoven (NL)

( * ) Notice: Subject to any disclaimer, the term of this patent is extended or adjusted under 35 U.S.C. 154(b) by 351 days.

(21) Appl. No.: 12/594,967

(22) PCT Filed: Apr. 3, 2008

(86) PCT No.: PCT/IB2008/051249
§ 371 (c)(1),
(2), (4) Date: Oct. 7, 2009

(87) PCT Pub. No.: WO2008/125998
PCT Pub. Date: Oct. 23, 2008

(65) Prior Publication Data
US 2010/0109676 A1    May 6, 2010

(30) Foreign Application Priority Data
Apr. 12, 2007 (EP) .................................. 07106032

(51) Int. Cl.
*G06F 17/50* (2006.01)
(52) U.S. Cl. ........................................ 716/136; 716/137
(58) Field of Classification Search .......... 716/106–109, 716/136, 137
See application file for complete search history.

(56) References Cited

U.S. PATENT DOCUMENTS

| | | | |
|---|---|---|---|
| 6,263,476 B1 * | 7/2001 | Browen et al. | 716/112 |
| 6,850,877 B1 | 2/2005 | Sengupta | |
| 7,003,742 B2 * | 2/2006 | Saxena et al. | 716/102 |
| 2003/0065494 A1 | 4/2003 | Croix | |
| 2005/0183048 A1 | 8/2005 | Kinzelbach | |

OTHER PUBLICATIONS

Liu, Fang, et al; "Fast Hierarchical Process Variability Analysis and Parametric Test Development for Analog/RF Circuits"; Proceedings of the 2005 Int'l Confernece on Computere Design; IEEE; 2005; p. 161-170; XP010846358; ISBN: 978-0-7695-2451-1.
Pelgrom, M., et al; "Matching Properties of MOS Transistors"; IEEE Journal of Solid-State Circuits; 1989; pp. 1433-1440.

(Continued)

*Primary Examiner* — Jack Chiang
*Assistant Examiner* — Binh Tat

(57) ABSTRACT

Test vectors for structural testing of an analog circuit are selected by first selecting an initial set of test input vectors for the analog circuit. A set of faults is selected, comprising faults that each correspond to a respective node in the analog circuit and corresponding fault voltage value for that node. A measure of overlap is computed between probability distributions of test output signal values for the analog circuit in response to the test input vectors in the presence and absence of each of the faults from said set of faults respectively, as a function of estimated statistical spread of component and/or process parameter values in the analog circuit. Test input vectors are selected from the initial set of test input vectors for use in testing on the basis of whether the measure of overlap for at least one if the faults is below a threshold value in response to the selected test input vector under control of the test selection computer.

11 Claims, 1 Drawing Sheet

OTHER PUBLICATIONS

Chen, Jin, et al; "A Novel Test Set Design for Parametric Testing of Analog and Mixed-Signal Circuits"; Computer Design: VLSI in Computers and Processors, 1997; 1997 IEEE Int'l Conference on, Austin, TX; Oct. 12, 1997; pp. 474-480; XP010251776; ISBN: 978-0-8186-8206-3.

Database Inspec (Online) The Institution of Electrical Engineersk Stevenage, GB; Dec. 2006; Zjzjo, A, et al; "Structural Fault Modeling and Fault Detection Through Neyman-Pearson Decision Criteria for Analog Integrated Circuits"; XP002492861; Retrieved From http://www.springerlink.com/content/B42P6023L284428/ Database Accession No. 9317869; and Journal of Electronic Testing: Theory and Applications Kluwer Academic Publishers; Netherlands.

Liu, Fang, et al; "Hierarchical Analysis of Process Variation for Mixed-Signal Systems";ASP-DAC 2005; IEEE; pp. 465-470.

* cited by examiner

ANALOG CIRCUIT TESTING AND TEST PATTERN GENERATION

FIELD OF THE INVENTION

The invention relates to analog circuit testing, and to testing of integrated circuits that contain analog circuits.

BACKGROUND

Circuits can be tested by means of functional tests and structural tests. Functional testing involves a determination whether the circuit properly performs the function for which it is designed. Structural testing involves performing measurements from which it can be inferred in-circuit whether the performance of all components of the circuit (including connections) is normal. An advantage of structural testing is that the same, simple, standardized measurements can be used for different types of circuit during structural testing. If the circuit has been properly designed and a structural test shows that all relevant components have normal performance, it may be expected that the circuit properly performs its function. Therefore a circuit that passes a structural test generally will also pass functional tests.

Structural testing is well established for digital circuits, but structural testing of analog circuits is less usual. One reason for this is that it is difficult to select measurements that can be applied to a circuit to detect the presence of faulty components in that circuit. In analog circuits faulty components can be components with abnormal parameter values, such as transistors with abnormal threshold voltages or current amplification factor. The effect of a faulty parameter value of a component can be more easily masked by the natural spread of the parameter values of other components in the circuit. This makes it more difficult to determine which test measurements can be used to discover the presence of faults in any, or most components. For digital circuits planning of test measurements involves selecting a set of possible structural faults and determining test measurements that can be applied to the circuit in which respective faults will show up. For digital circuits the set of faults is often the set of "stuck at" faults for circuit nodes, wherein the logic signal remains at the same level irrespective of input signals. Test input signals are selected that should normally affect the logic level at the node and test output signals are selected that should normally depend on the logic level of the node.

Planning of analog circuit testing likewise involves selecting a set of faults and test input and output signals that show up these faults. However, in analog circuits the test output signals of different fault free circuits will be spread due to natural parameter spread. Similarly the test output signals of different circuits with the same fault will be spread. Accordingly, tests must be selected where the output signal spread of fault free and faulty circuits have little or no overlap.

A method of evaluating test signals is disclosed in an article by Fang Liu et al titled "Fast Hierarchical Process Variability Analysis and Parametric test Development for Analog/RF Circuits", in the Proceedings of the 2005 International conference on computer design (ICCD'05). Fang Liu sets each component parameter values to a series abnormal values and evaluates whether a functional test output signal is sufficiently affected by this that the spread in this output signal of circuits with this fault does not, or only insignificantly, overlap with the spread in this output signal of normal circuits. Fang Liu uses this to compute the effect on functional signals of all parameters of all transistors.

Fang Liu uses a linearized model to compute the effect of the faults and spread of parameters. Thus, even though a significant amount of computation is required, test signals can be evaluated for fairly complex circuits. From this a selection of test input and output signals can be made in which any selected fault in any component can be detected.

However, for analog circuits this approach does not properly predict detectability of faulty circuits. One reason for this is that deviations of component parameter values (both normal and abnormal deviations) may be correlated. If no account of this is taken the computed output signal spread for circuits with components with normal and abnormal parameter values does not correspond to reality, with the effect that fault coverage is not predicted correctly. On the other hand, taking account of all possible correlations may considerably increase the required amount of computation.

SUMMARY

Among others, it is an object to provide for an improved method of testing analog circuits.

Among others, it is an object to provide for an improved prediction of detectability of structural faults in analog circuits in test measurements applied to the analog circuits.

The method according to the invention is set forth in claim 1. Herein a set of faults is selected that comprises faults that each correspond to a respective node in the analog circuit and corresponding fault voltage value for that node under control of the test selection computer. Test input vectors are evaluated by determining a measure of overlap of the response in the presence and absence of each of the faults from this set of faults. The measure of overlap is used to select and/or sequence test vectors for use during testing.

In an embodiment for each fault a parameter or group of parameters of a component or a group of components that is directly connected to the node defined by the fault. Deviating values for the parameter or group of parameters with a size that has the effect of changing the voltage at the node to the node voltage defined by the fault and the measure of overlap between is computed using circuit behavior computed for a version of the analog circuit wherein the parameters or group of parameters has or have the selected deviation values.

In an embodiment the fault voltages may be selected dependent on the test input vectors. Thus the faults used to evaluate test vectors may be adapted to the test vectors to obtain more reliable results. Power supply currents may be used as test output signals. Thus, a general test output is obtained that can be applied to many circuit designs, irrespective of their function. Different power supply voltage levels may be used as different test input signals. Thus, a general test input is obtained that can be applied to many circuit designs.

Alternatively, or in addition, signal input level variations and output signals may be used for testing, to provide for design dependent tests. Static test signals may be used, but in addition test waveforms applied to power supply terminals or signal terminals may be used. This makes it possible to provide for more tests to obtain better test coverage.

BRIEF DESCRIPTION OF THE DRAWINGS

These and other objects and advantages will become apparent from a detailed description of exemplary embodiments, using the following figures.

DETAILED DESCRIPTION OF EXEMPLARY EMBODIMENTS

Figure 1:
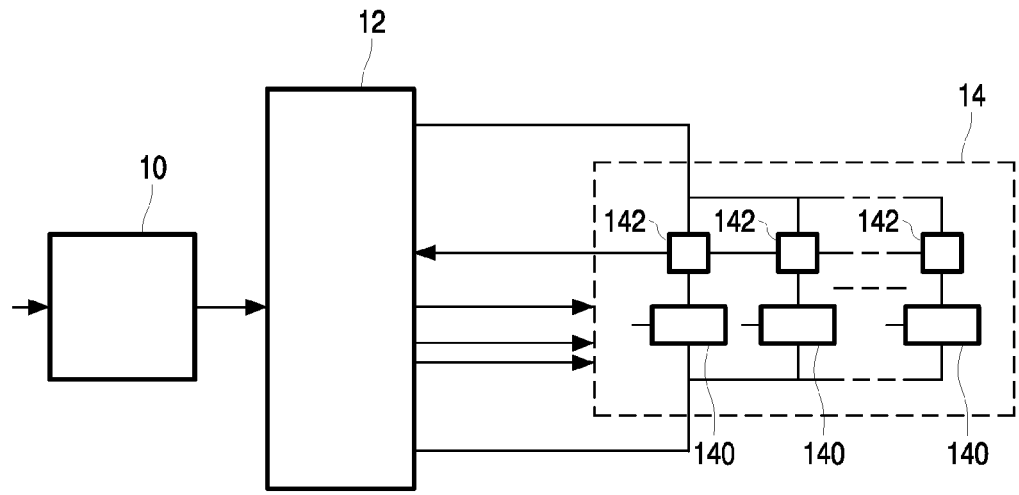
FIG. 1 shows a test system

FIG. 1 shows a test system. The test system comprises a test selection computer 10, a test application apparatus 12 and a circuit under test 14. By way of example the circuit under test is shown to comprise a number of function circuit parts 140, each in combination with a power supply monitoring circuit 142. This is directed at a test that uses power supply currents as test output signals to determine whether the circuit under test 14 contains faults. Although this is a preferred approach, it should be appreciated that other type of test output signals may be used instead, in which case no power supply monitoring circuits 142 may be needed.

Test selection computer 10 has a communication channel with test application apparatus 12. Test application apparatus 12 has power supply outputs coupled to power supply connections of circuit under test 14. Functional circuit parts 140 are coupled in series with respective ones of power supply monitoring circuits 142 between the power supply outputs of test application apparatus 12. Outputs of power supply monitoring circuits 142 are coupled to test application apparatus 12 (for the sake of simplicity a chained connection of power supply monitoring circuits is shown, but any other connection may be used). Test application apparatus 12 has signal application outputs coupled to circuit under test 14. (as used herein the term "signals" will be used to include signals that are time dependent in actual use and signals that are constant, such as bias voltages). The signal application outputs may be coupled to inputs of functional circuit parts 140 (connecting circuits not shown). Furthermore, functional circuit parts 140 may have inputs and outputs coupled to each other through functional connections (not shown). In an embodiment the circuit under test 14 comprises a test control circuit (not shown), to enable connections for test purposes between the test signal outputs and selectable inputs of functional circuit parts 140. Similarly, the test control circuit may disconnect connections between functional circuit parts 140 during test.

In operation test selection computer 10 receives information representing a circuit design of the circuit under test 14. This information will be referred to as the "netlist", as used herein this term refers to a list of components of the circuit under test, indicating their type and their connections to other components of the circuit under test and/or inputs and outputs of the circuit under test. From this information representing the design, using a process to be described in the following, test selection computer 10 selects a set of tests and/or a sequence of these tests. The tests may involve for example application of selected power supply voltages to the circuit under test, optional in combination with selected input signals, and comparison of resulting power supply currents with predicted current values. Information identifying the selected tests and/or their sequence is passed from test selection computer 10 to test application apparatus 12. Under control of this information test application apparatus 12 applies the selected tests to circuit under test 14. If as a result of these tests test application apparatus 12 determines that circuit under test 14 does not meet conditions specified by the tests, circuit under test 14 is rejected as faulty.

If circuit under test 14 meets the conditions it is passed or optionally subjected to further tests, such as functional tests. The functional tests are typically circuit specific and may include measuring gain values, filter bandwidths, delay times etc. of functional components of the circuit under test, for comparison with specified values. Typically, such measurements are complex and have to be designed specifically for each type of circuit. By performing structural tests first, needless test time, tester occupation, costs etc for applying this form of testing may be avoided.

It should be appreciated that other test output signals may be measured instead of, or in addition to power supply currents. The use of power supply currents is merely an example of a preferred approach, which has the advantage that it can be applied to any circuit design. Furthermore, it should be appreciated that test selection and/or sequence selection by test selection computer 10 need be performed only once for a specific circuit type, i.e. a class of circuits with the same design. Subsequently test application apparatus 12 may use the resulting tests and/or sequence of tests repeatedly for successive circuits under test 14 of that circuit type.

Figure 2:
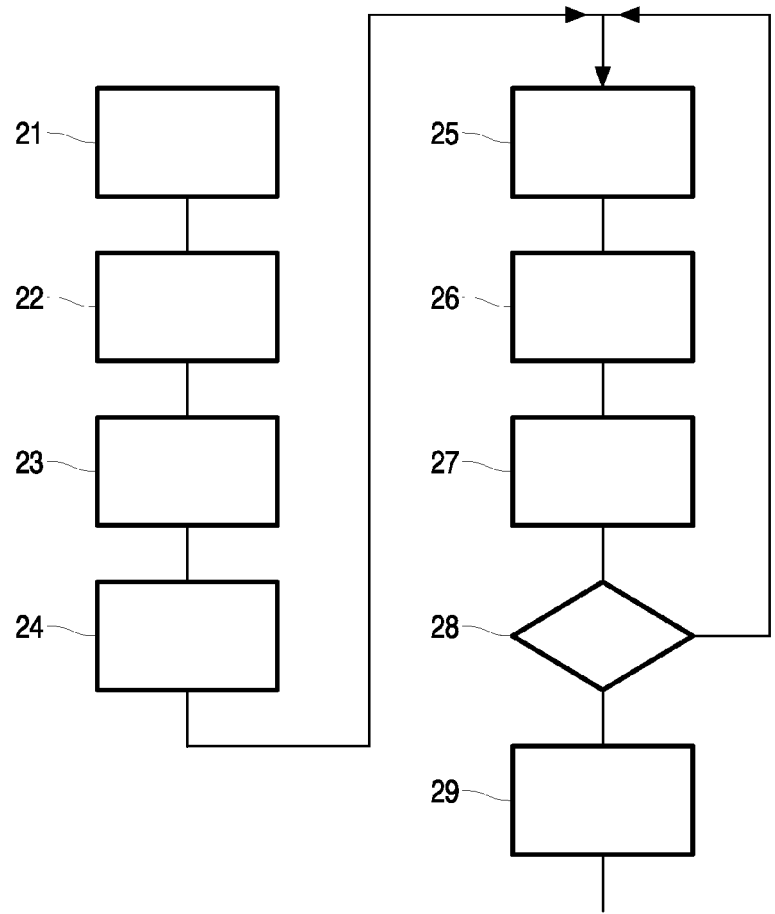
FIG. 2 shows a flow chart of test selection

FIG. 2 shows a flow chart of the analog test pattern generation process. In a first step 21 test selection computer 10 receives the information specifying the circuit design. In an embodiment this information defines the components used in this circuit, for example in terms of component type and parameters (transistors, resistors, capacitors etc., and parameters such as information that the transistor has been manufactured in a specified type of process, has a specified nominal gate width length etc., that the resistor has been manufactured in a specified type of process and has a specified nominal resistance etc.). Furthermore this information defines the connections between the components.

In a second step 22 test selection computer 10 selects a set of possible test input signal vectors V. In its simplest form each vector V consists of a power supply voltage value, different vectors V containing mutually different power supply voltages. In more advanced forms each input vector V may comprise a combination of a power supply voltage value and input signal values to be applied to different functional circuit parts, or even one or more temporal signal and/or power supply voltage variation patterns.

In a third step 23 test selection computer 10 computes nominal node voltages at circuit nodes in the circuit under test and the nominal power supply currents drawn by the functional circuit parts of the circuit under test in response to each of the vectors V as well as the spread (e.g. the standard deviation or variance) of quantities due to normal component parameter value spread.

In a fourth step 24 test selection computer 10 selects a set of faults. Each fault corresponds to a combination (N,F) of a circuit node N in the design of the circuit under test 14 and a faulty voltage value F of the voltage at that node. In an embodiment, different faults correspond to triples (V,N,F) each of a respective test vector V in combination with a respective nodes N and a node voltage F that deviates from the nominal node voltage in the fault free circuit.

In a fifth step 25 test selection computer 10 selects one fault from the set of faults at a time. In a sixth step 26 test selection computer 10 computes the nominal power supply currents drawn by the functional circuit parts of the circuit under test when the fault is present, as well as the spread of these power supply currents due to normal component parameter value spread when the fault is present. In an embodiment, this is performed for all input signal vectors in the set of possible test input vectors.

In a simple embodiment the fault may be injected in the circuit by adding a voltage source to the design, to impose the fault voltage F on the node N. However, it is preferred to realize the fault by replacement of components in the model. In an embodiment of sixth step 26 the computation of the nominal power supply currents and their spread in the presence of the fault is performed using an amended circuit design, the amendment comprising replacement of one or more transistors and/or other components of the design by components with deviating parameter values. In this embodiment the deviation parameter values of these replacement components are selected so as to realize the node voltage F of the selected fault.

In a simple implementation of this embodiment a single component, which is directly connected to the node N of the fault, is systematically selected and one parameter of this single component is changed by an amount needed to realize the node voltage F. The required amount of change may be obtained for example by solving the parameter from a model of circuit behavior that is linearized around nominal operation of the fault free circuit.

In a further embodiment a plurality of parameter faults is generated from the node fault, each corresponding to a respective one of the components that is directly connected to the node N. In this embodiment one parameter of the respective single component is changed by an amount needed to realize the node voltage F. The required amount of change may be obtained for example by solving the parameter from a model of circuit behavior that is linearized around nominal operation of the fault free circuit.

Alternatively a plurality of parameter may be changed. A direction vector may be used, with vector components that indicate the relative proportions in the changes of the different parameters. In this case the changes in the parameters are a factor times the direction vector. The required factor may be obtained for example by solving the parameter from a model of circuit behavior that is linearized around nominal operation of the fault free circuit. In a further embodiment predetermined direction vectors, obtained from the relative sizes of the spread (e.g. standard deviation) in measurements different parameters in reference components e.g. in PCMs, the signs of the changes being selected so that all changes effect circuit speed in the same direction.

In another implementation a combination of all components connected to the node N of the fault may be selected, or a group containing a plurality of such components may be selected, and a combination of parameters of theses component is changed by an amount needed to realize the node voltage F. The amount may be selected by the techniques described for the implementation using a single component.

In seventh step 27 test selection computer 10 determines which, if any, of the power supply currents are suitable for detecting the fault. In an embodiment this involves determining the amount of overlap of the spread around the nominal power supply current for the fault free circuit with the spread around the nominal power supply current with the fault. Alternatively a measure of overlap may be used between probability distributions of the power supply current in the presence and the absence of the fault. The overlap, or the measure of overlap is compared with a threshold: when the overlap, or the measure of overlap is below the threshold, it is determined that the power supply current is suitable for detecting the fault. In an embodiment the determination of the suitability for detecting the fault is done for all input signal vectors in the set of possible test input vectors. Selection computer 10 records which of the test input vectors are useful to detect the fault.

In addition, seventh step 27 may include selection of test thresholds corresponding to suitable power supply currents and/or test input vectors, for use during testing. If possible test selection computer 10 selects the test threshold for a test that is suitable to detect a fault so that, according to the computed spreads, none of the circuits with fault will be passed and all circuits without faults will be passed. If some overlap cannot be avoided, the test threshold is selected by means of an optimization process, searching for a value that minimizes a composite error criterion in terms of the expected fraction of circuits with the fault that will be passed and the number of circuits without faults that will be accepted as a function of the test threshold. The known Neymann Pearsson criterion may be used for example. In this case a significance level is set (i.e. a required maximum test error probability) and the threshold is computed from the significance level and the statistical parameters.

In eight step 28 selection computer 10 determines whether all faults from the set of faults have been evaluated, if not the process returns to fifth step 25 to select a next fault. Once all faults have been processed selection computer 10 proceeds to ninth step 29, which performs automatic test pattern generation (ATPG), selecting a set of test measurements that will actually be performed and/or the sequence of performing tests. Each test measurement comprises a test input vector and a selection of test output signals that have to be measured, as well as a critical value against which the test output signal must be compared. Preferably, a minimum number of tests is selected that will detect all faults. Because the result of the preceding steps is in the form of a yes/no indication whether a test is suitable, just as for digital circuit tests, ATPG methods may be used that are known per se for example for digital circuit test selection. ATPG methods will therefore not be described in detail. Also preferably, a sequence is selected that will result in a minimum average test time, for example by executing a test that is expected to detect most faulty circuits first in the circuit, followed by a test that is expected to detect most remaining faulty circuits and so on.

In an embodiment the test stimuli with high fault coverage are placed first, in the sequence. In a first step test stimuli that have very low fault coverage are eliminated from the test stimuli set, and then the remaining test stimuli are ordered. Two approaches to test stimuli ordering are considered: In the first approach, the test stimuli are ordered so that the test stimuli that detect the most-faulty parameters that are detected by no other test stimuli are performed first. In the second stage, going from top to bottom, test stimuli, which do not increase the cumulative coverage, are moved to the bottom of the list. Because some test stimuli are eliminated from the test stimuli set before the test stimuli's are ordered, both algorithms are heuristic, and both can handle circuits with many more specifications at much less computation cost. In order to find optimum test stimuli set, the algorithm tries various permutations of the test stimuli set. The more costly test stimuli are considered first, and the less costly test stimuli are considered last.

After the set of test measurements has been selected, information describing the set is supplied from test selection computer 10 to test signal application apparatus 12. This circuit performs the selected test measurements, applying the signals from each test input vector in combination to the circuit under test, measuring the test output signals from the circuit under test and comparing them with the selected test thresholds. Alternatively, the comparison may be performed in the circuit under test. When all comparisons indicate test output signals on the fault free side of the test thresholds, the circuit under test is passed, otherwise it is rejected. Typically this is repeated for a plurality of circuits under test.

It should be appreciated that the set of faults used in this process includes faults corresponding to deviating node voltages. Typically, such deviations will be the result of deviating component parameter values (e.g. deviating transistor threshold values, current gain etc.), which in turn may be the result of deviating process parameters (deviating oxide thickness, doping concentration, gate width etc.). The effect of all these parameter deviations is modeled by means of the node voltage deviations. Furthermore, it should be noted that in many cases node voltage values in the fault free circuit depend on the test input vector (including voltages applied to the circuit under test). In such cases, unlike faults expressed in terms of deviating component or process parameters, the faults expressed as deviating node voltage cannot be selected independently from the test input vectors. Accordingly, different faults are preferably defined for different test input vectors.

In an embodiment the voltage values F in the definition of the faults are selected as a factor times the computed spread in the node voltage in a fault free circuit, e.g. three times the standard deviation of the node voltage. Thus a computation of the spread is used to select the modeled fault. Although such a node voltage does not necessarily correspond to a circuit that will fail its functional specification, it is suitable as a fault, because on one hand it can be verified during design whether the circuit properly performs its function in the presence of such a voltage deviation and on the other hand the number of functionally correct circuits that will fail a structural tests under this criterion is small. In an embodiment the spread may be computed once, for one test input vector and used to determine the deviation of the fault voltage value F from the nominal voltages at the node for all test input vectors. In another embodiment respective spreads may be computed for each test input vector and use to determine the fault voltage value F from the nominal voltage at the node for the corresponding test input vector.

In another embodiment the node voltage value F in the definition of the fault is selected by selecting fault values for component parameters (e.g. for transistor threshold levels or current gains) or process parameters (e.g. oxide thickness) of individual components, and a computation the effect of the values of the component/process parameters on the node voltage. In this case too, one deviation may be selected for all test input vectors, or individual deviations may be selected for each of the test input vectors respectively.

In one example, the node voltage deviation is determine by replacing a fault-free transistors defined in the circuit netlist by a transistor with a component/process parameter, which causes the performance to be the worst from the nominal process parameter value.

Alternatively a group of transistors with a component/process parameter with such a value may be used as a replacement for corresponding fault free transistors. Alternatively a transistor, or group of transistors, with a group of component/process parameters with such a value may be used.

In addition to replacement of transistors, replacement of other components in the circuit, such as resistors, diodes, capacitors etc may be used. The component/process parameter (or groups thereof) of the replacement component may be selected on the basis of measurements of statistical spread of these parameters in PCM modules. Also, "process corners" may be defined in terms of combinations of component/process parameter value deviations that all lead to a faster circuit or all lead to a slower circuit. In this embodiment the component/process parameters of the replacement component are selected to be in one of the process corners, with a deviation size for each parameter equal to a factor times the statistical spread (e.g. standard deviation) in the parameter.

It should be carefully noted that, although component/process parameters are used to select the faulty node voltage value, individual component/process parameters values are not directly used as faults for which the detectability is determined in order to select and/or sequence test input vectors. Thus, although an individual component/process parameter value deviation usually implies correlated voltage deviations at a plurality of circuit nodes, at least part of the faults is selected as a deviating voltage at an individual circuit node, using the node voltage value determined using the component/process parameter value deviation for that individual circuit node and ignoring node voltage value deviations for other circuit nodes. This will improve fault coverage that can be realized with a certain amount of computation, because faults with node voltage deviations can be processed more quickly. Furthermore correlations between node voltage deviations computed from component/process parameter value deviation are not realistic in any case when correlations between component/process parameter value deviations are neglected.

In order to incorporate the fault model analytical computation and non-analytical computations may be used. To analytically compute voltage deviations $\Delta V_n$ at the particular node n, firstly, the parameters partial derivatives to the requested performance function (node voltage or power supply current) are computed using the circuit's netlist. This results in a set of simultaneous linear equations for the performance parameters. Next, the linear equations are solved. After variance is determined the bounds of the tolerance window are calculated. The spread of the process parameters is extracted through wafer measurements or through a statistical analysis. The fault model, which forces the node voltage outside the tolerance window is build and faults are injected in the circuit.

In the non-analytical approach, the circuit is analyzed according to the test program and transistors connected to a node n are recognized. Next, the spread of the process parameters is extracted through wafer measurements or through a statistical analysis. Deviation values are assigned to process parameters defined in the fault model and these models are injected in the circuit netlist.

For both approaches, after simulating the circuit netlist the results are saved in the database from where these results can be extracted and used within automatic test pattern generation (ATPG) flow.

In an embodiment test selection computer 10 computes the spread of test output signals and node voltages using a linearized model of the circuit. In a first step test selection computer 10 computes the circuit response to a test input vector. In a second step the partial derivates of the node voltage and/or test output signals with respect to component/process parameters at this nominal response are determined. In a third step the spread in the node voltage and/or test output signals is computed as a sum of the square of the partial derivatives with respect to respective component/process parameters multiplied by the using the variance of the parameter, plus a sum of cross products of pairs of partial derivatives with respect to respective pairs of component/process parameters multiplied by the covariance of the pair of parameters (i.e. the expected value of the product of their deviations from the nominal values).

In an embodiment the variances and covariances are obtained from PCM measurements, i.e. form direct measurements on components modules that are provided in special modules an integrated circuit wafer.

The tolerance window may be computed using a mismatch model. The mismatch of two closely spaced, identical MOS transistors has been extensively investigated down to deep-submicron device sizes. A general parameter mismatch variance model was first derived in M. Pelgrom, A. C. J. Duinmaijer, A. P. Welbers, "Matching Properties of MOS Transistors", IEEE Journal of Solid-State Circuits, pp. 1433-1440, 1989. We next describe how the tolerance window can be computed without resorting to Monte Carlo simulations.

Without loss of generality let us consider two transistor parameters, e.g. threshold voltage $V_T$ and current factor $\beta$. Experimental data shows that threshold voltage differences $\Delta V_T$ and current factor differences $\Delta\beta$ are the dominant sources underlying the drain-source current or gate-source voltage mismatch for a matched pair of MOS transistors. These random differences for the single transistor have a normal distribution with zero mean and a variance dependent on the device area WL $$\sigma_{\Delta V_T} = \frac{A_{V_T}/\sqrt{2}}{\sqrt{W_{eff}L_{eff}}} + B_{V_T}/\sqrt{2} + S_{V_T}D \tag{1}$$

$$\sigma_{\Delta\beta/\beta} = \frac{A_\beta/\sqrt{2}}{\sqrt{W_{eff}L_{eff}}} + B_\beta/\sqrt{2} + S_\beta D$$

where $W_{eff}$ is the effective gate-width and $L_{eff}$ the effective gate-length, the proportionality constants $A_{VT}$, $S_{VT}$, $A_\beta$ and $S_\beta$ are technology-dependent factors, D is distance and $B_{VT}$ and $B_\beta$ are constants. For widely spaced devices terms $S_{VT}D$ and $S_\beta D$ are included in the models for the random variations in (1), but for typical device separations (<1 mm) and typical device sizes this correction is small. Most mismatch characterization has been performed on devices in strong inversion in the saturation or linear region but some studies for devices operating in weak inversion have also been conducted. Qualitatively, the behavior in all regions is very similar; $V_T$ and $\beta$ variations are the dominant source of mismatch and their matching scales with device area. Considering the $V_T$ and $\beta$ variations of each transistor ($\Delta V_T$ and $\Delta\beta$) from their nominal values ($V_{Ti0}$ and $\beta_{i0}$), a circuit performance described by the function $f(V_T, \beta)$, can be written as $$f(V_T,\beta) = f(V_{T1}, \ldots, V_{Tn}, \beta_1, \ldots, \beta_n) = f(V_{T10} + \Delta V_{T1}, \ldots, V_{Tn0} + \Delta V_{Tn}, \beta_{10} + \Delta\beta_1, \ldots, \beta_{n0} + \Delta\beta_n) \tag{2}$$

Expanding the circuit performance function $f(V_T,\beta)$ in multi-variable Taylor series for the variables $\Delta V_{T1}, \ldots, \Delta V_{Tn}$ and $\Delta\beta_1, \ldots, \Delta\beta_n$, around their mean ($=0$), the mean $\mu_{f(VT,\beta)}$ and $\sigma_{f(VT,\beta)}$ of the circuit performance function, can be estimated as $$\mu_{f(V_T,\beta)} = f(V_{T0}, \beta_0) + \frac{1}{2}\sum_{i=i}^{n}\left\{\begin{array}{l}\frac{\partial^2 f(V_T,\beta)}{\partial V_{Ti}^2}\sigma_{V_{Ti}}^2 + \\ 2\frac{\partial^2 f(V_T,\beta)}{\partial V_{Ti}\partial\beta_i}\sigma_{V_{Ti}}\sigma_{\beta_i}\rho + \\ \frac{\partial^2 f(V_T,\beta)}{\partial\beta_i^2}\sigma_{\beta_i}^2\end{array}\right\} \tag{3}$$

$$\sigma_{f(V_T,\beta)}^2 = \sum_{i=i}^{n}\left\{\begin{array}{l}\left(\frac{\partial f(V_T,\beta)}{\partial V_{Ti}}\right)^2\sigma_{V_{Ti}}^2 + \\ 2\left(\frac{\partial f(V_T,\beta)}{\partial V_{Ti}}\right)\left(\frac{\partial f(V_T,\beta)}{\partial\beta_i}\right)\sigma_{V_{Ti}}\sigma_{\beta_i}\rho + \\ \left(\frac{\partial f(V_T,\beta)}{\partial\beta_i}\right)^2\sigma_{\beta_i}^2\end{array}\right\} \tag{4}$$

where n is total number of involved transistors in the circuit and $\mu_{f(VT,\beta)}$ is the mean of $f(V_T,\beta)$ over the local or global parametric variations. $f(V_{T0}, \beta_0)$ is the nominal value of the performance function i.e., variations $\Delta V_T=0$ and $\Delta\beta=0$ for all n transistors and $\rho$ is the correlation coefficient $$\rho = \frac{\mu_{f(V_T,\beta)} - \mu_{f(V_T)}\mu_{f(\beta)}}{\sigma_{V_T}\sigma_\beta} \tag{5}$$

The tolerance window is defined as the band containing all the possible circuit output performances when the parameters are changed with all the possible values. Therefore, the tolerance window can be expressed with the band $[f(V_T,\beta)_{min}, f(V_T,\beta)_{max}]$, where $f(V_T,\beta)_{min}$ and $f(V_T,\beta)_{max}$ from (3) and (4) are defined as:

$$f(V_T,\beta)_{min} = \mu_{f(V_T,\beta)} - \sqrt{\sum_{i=1}^{n}\left(\frac{\partial f(V_T,\beta)}{\partial V_{Ti}}\right)^2\sigma_{V_{Ti}}^2 + \left(\frac{\partial f(V_T,\beta)}{\partial\beta_i}\right)^2\sigma_{\beta_i}^2} \tag{6}$$

for $\rho = 0$ $$f(V_T,\beta)_{max} = \mu_{f(V_T,\beta)} + \sqrt{\sum_{i=1}^{n}\left(\frac{\partial f(V_T,\beta)}{\partial V_{Ti}}\right)^2\sigma_{V_{Ti}}^2 + \left(\frac{\partial f(V_T,\beta)}{\partial\beta_i}\right)^2\sigma_{\beta_i}^2} \tag{7}$$

for $\rho = 0$ where $\sigma^2_{VT,\beta}$ assumes the maximum allowed parameter variation.

In an embodiment ninth step 29 starts from a predetermined set of test input vectors that includes vectors with respective, mutually different supply voltage values and the same standard signal input values for each test vector. In this embodiment test selection computer 10 first determines missing faults, which are defined as faults that cannot be detected from power supply current measurements using these test input vectors. Subsequently, test selection computer 10 selects additional test input vectors that are operable to detect the presence of these missing faults, by searching for test input vectors with non standard signal input values (signal input values, as used herein including both values of signals that are time dependent during normal operation of the circuit under test and bias signals that are time independent during normal operation of the circuit under test). In addition, the additional test input vectors may include test vectors with time-dependent waveforms for selected signal inputs and/or the power supply input. In this case the test output signals used to detect faults may include a series of sampled values of test output signals, sampled in a predetermined temporal relation relative to the time of application of the test input waveform, or average test output signal in a predetermined time interval in a predetermined relative temporal relation relative to the time of application of the test input waveform Using standard ATPG selection techniques the number of additional tests needed to cover these missing faults can be minimized.

Other variations to the disclosed embodiments can be understood and effected by those skilled in the art, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method of testing an analog circuit, the method comprising
   selecting an initial set of test input vectors for the analog circuit under control of a test selection computer;
   selecting a set of faults comprising faults that each correspond to a respective node in the analog circuit and corresponding fault voltage value for that node under control of the test selection computer;
   computing, under control of the test selection computer, a measure of overlap between probability distributions of test output signal values for the analog circuit in response to the test input vectors in the presence and absence of each of the faults from said set of faults respectively, as a function of estimated statistical spread of component and/or process parameter values in the analog circuit;
   selecting test input vectors from the initial set of test input vectors for use in testing on the basis of whether the measure of overlap for at least one if the faults is below a threshold value in response to the selected test input vector under control of the test selection computer wherein said computing comprises:
   selecting for each fault a parameter or group of parameters of a component or a group of components that is directly connected to the node defined by the fault; selecting deviating values for the parameter or group of parameters with a size that has the effect of changing the voltage at the node to the node voltage defined by the fault; computing the measure of overlap between probability distributions using circuit behavior in the presence of the fault computed for a version of the analog circuit wherein the parameters or group of parameters has or have the selected deviation values.

2. A method of testing according to claim 1, comprising applying the selected test input vectors to the analog circuit under control of test selection control data produced by the test selection computer and measuring the test output signal values in response to the selected test input vectors.

3. A method of testing according to claim 1, wherein the step of selecting a set of faults comprises selecting faults that each correspond to a combination of the respective node, a respective one of the test input vectors and a respective fault voltage, a plurality of respective corresponding fault voltages being selected for the respective node, corresponding to respective ones of the test input vector.

4. A method of testing according to claim 1, wherein the test output signals comprise at least one power supply currents to at least a part of the analog circuit.

5. A method of testing according to claim 1, wherein the test input vectors comprise at least two vectors wherein mutually different power supply voltages are applied to a power supply input of the analog circuit.

6. A method of testing according to claim 5, wherein the test input vectors comprise at least two vectors wherein mutually different signal values are applied to a signal input of the analog circuit.

7. A method of testing according to claim 1, wherein the test input vectors comprise at least two vectors wherein mutually different temporal waveforms are applied to an input of the analog circuit.

8. A method of testing according to claim 1, wherein transistor mismatch is accounted for in the computation of the measure of overlap.

9. A method of testing according to claim 8, wherein the measure of overlap is determined from tolerance windows computed from a transistor mismatch model.

10. A method of testing according to claim 1, comprising
    providing a predetermined set of test measurements;
    selecting an initial set of faults;
    computing the measure of overlap between probability distributions of test output signal values for the analog circuit in response to the test input vectors from measurements in the predetermined set of test measurements in the presence and absence of each of the faults from the initial set of faults respectively;
    selecting the set of faults from faults in the initial set of faults for which the measure of overlap for at least one if the faults is below a threshold value in response to all of the test input vectors in the predetermined set of test measurements.

11. A method of testing according to claim 10, comprising
    applying the test measurements from the predetermined set of test measurements to the analog circuit; and
    applying the selected test input vectors to the analog circuit and measuring the test output signal values in response to the selected test input vectors.

* * * * *